US00RE34718E

United States Patent [19]

Tobita

[11] E Patent Number: Re. 34,718

[45] Reissued Date of Patent: Sep. 6, 1994

[54] DRAM WITH REDUCED-TEST-TIME-MODE

[75] Inventor: Youichi Tobita, Itami, Japan

[73] Assignee: Mitsubishi Denki Kabushiki Kaisha, Tokyo, Japan

[21] Appl. No.: 748,340

[22] Filed: Aug. 22, 1991

Related U.S. Patent Documents

Reissue of:

[64] Patent No.: 4,860,259
Issued: Aug. 22, 1989
Appl. No.: 278,374
Filed: Dec. 1, 1988

U.S. Applications:

[63] Continuation of Ser. No. 939,137, Dec. 8, 1986, abandoned.

[30] Foreign Application Priority Data

Jan. 21, 1986 [JP] Japan ..... 61-12319

[51] Int. Cl.[5] ..... G11C 7/00; G11C 29/00

[52] U.S. Cl. ..... 365/201; 365/189.01; 365/226; 365/189.11; 371/21.2

[58] Field of Search ..... 365/189.01, 189.09, 365/189.11, 200, 201, 226, 233; 371/21.2

[56] References Cited

U.S. PATENT DOCUMENTS

| | | | |
|---|---|---|---|
| 4,055,754 | 10/1977 | Chesley | 365/201 |
| 4,495,603 | 1/1985 | Varshney | 365/233 |
| 4,541,090 | 9/1985 | Shiragasawa | 371/21 |
| 4,543,647 | 9/1985 | Yashida | 365/201 |
| 4,612,630 | 9/1986 | Rosier | 365/201 |
| 4,651,304 | 3/1987 | Takata | 365/201 |
| 4,654,849 | 3/1987 | White, Jr. et al. | 371/21.1 |
| 4,672,583 | 6/1987 | Nakaizami | 365/201 |
| 4,686,456 | 8/1987 | Furuyama et al. | 371/21 |

FOREIGN PATENT DOCUMENTS

| | | |
|---|---|---|
| 043415A1 | 4/1981 | European Pat. Off. . |
| 0046215A2 | 2/1982 | European Pat. Off. . |
| 0055594A2 | 7/1982 | European Pat. Off. . |
| 0143624A2 | 6/1985 | European Pat. Off. . |
| 0186040A1 | 7/1986 | European Pat. Off. . |
| 0186051A2 | 7/1986 | European Pat. Off. . |
| 0197363A1 | 10/1986 | European Pat. Off. . |
| 0214508A2 | 3/1987 | European Pat. Off. . |
| 16176A1 | 11/1980 | Fed. Rep. of Germany . |

OTHER PUBLICATIONS

M. T. Swarakowski, "Redundant Clock Magnetic Recording", vol. 12, No. 2, Jul. 1969, p. 254.

Inoue et al., "An 85ns 1Mb DRAM in a Plastic DIP", ISCC 85, pp. 238–239, Feb. 15, 1985.

Kumanoya et al., "A 90ns 1Mb DRAM with Multi-Bit Test Mode", ISSCC 85, pp. 240–241, Feb. 15, 1985.

R. C. Cady et al., "RAM Internal Parallel Testing Technique", IBM TDB, vol. 27, No. 7B, Dec. 1984, pp. 4534–4536.

Abstract, *System for Updating and Controlling Main Key*, T. Chiba, Fujitsu K.K.; Appl. No. 57-31326, Feb. 27, 1982.

(List continued on next page.)

*Primary Examiner*—Joseph A. Popek

*Attorney, Agent, or Firm*—Sterne, Kessler, Goldstein & Fox

[57] ABSTRACT

In a semiconductor memory device comprising a plurality of memory cells, a test request detection circuit responds to a voltage, on an input terminal, higher than a range of voltages supplied under ordinary operation condition for producing a test signal. Responsive to the test signal, data which has been supplied to the semiconductor memory device are simultaneously written into a plurality of memory cells, and data are simultaneously read from a plurality of memory cells, and judgement is made as to whether or not the data from the memory cells coincide with the data originally supplied to the semiconductor memory device.

17 Claims, 8 Drawing Sheets

OTHER PUBLICATIONS

Abstract: *System for ControlLing Memory,* M. Matsumto, Fujitsu K.K.; Appl. No. 57-33414, Mar. 3, 1982.

Abstract: *System for Checking Memory,* M. Wakabayashi, USAC Denshi Kogyo K.K.; Appl. No. 57-33550, Mar. 3, 1982.

Abstract: *Semiconductor Storage Device,* J. Inoue, Nippon Denshin Denwa Kosha; Appl. No. 56-62424, Apr. 27, 1981.

Abstract: *Semiconductor Memory,* M. Ishikawa, Tokyo Shibaura Denki K.K.; Appl. No. 56-63004, Apr. 25, 1981.

Abstract: *Memory Device Having Redundancy,* S. Saitou, Tokyo Shibaura Denki K.K.; Appl. No. 57-179998, Apr. 25, 1981.

Abstract: *IC Card,* K. Hatsutori, Nippon Densh Denwa Kosha; Appl. No. 57215474, Dec. 10, 1982.

Abstract: *Data Checking Method of Electronic Memor* K. Tanaka; Appl. No. 57-215998, Dec. 8, 1982.

Abstract: *EPROM Memory Device with Test Circuit,* Takada; Appl. No. 57-216346, Dec. 9, 1982.

Abstract: *Memory Control System,* K. Furukawai, App No. 56-205303, Dec. 21, 1981.

Abstract: *Controller for Plural Storage Parts in Da Processing System,* Y. Chiwaki, Nippon Denki K.K Appl. No. 56-71471, May 14, 1981.

Abstract: *Semiconductor Storage Device,* M. Sato Tokyo Shibaura Denki K.K., Tokyo Shibaura Den K.K.; Appl. No. 56-72613, May 14, 1981.

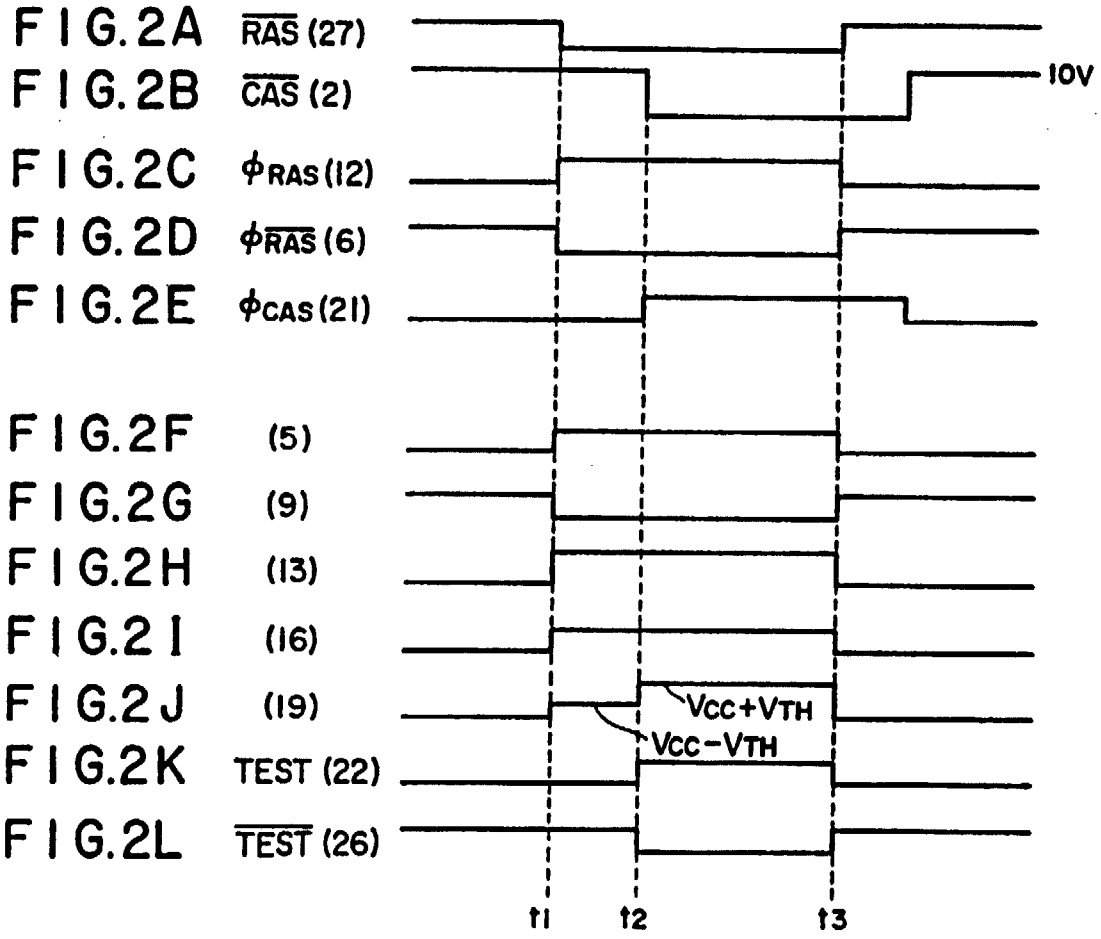
FIG.2A $\overline{RAS}$ (27)
FIG.2B $\overline{CAS}$ (2)
FIG.2C $\phi_{RAS}$ (12)
FIG.2D $\phi_{\overline{RAS}}$ (6)
FIG.2E $\phi_{CAS}$ (21)
FIG.2F (5)
FIG.2G (9)
FIG.2H (13)
FIG.2I (16)
FIG.2J (19)
FIG.2K TEST (22)
FIG.2L $\overline{TEST}$ (26)
10V
Vcc+VTH
Vcc−VTH
t1
t2
t3

FIG.5A RAS (27)
10V
FIG.5B CAS (2)
FIG.5C A (60)
ROW
COLUMN
ROW
FIG.5D R/W (70)
ARBITRARY
ARBITRARY
FIG.5E DIN (50)
ARBITRARY
DATA
ARBITRARY
FIG.5F W (53)
FIG.5G R (64)

FIG.5L TEST (22)
FIG.5M TEST (26)
t1
t2
t3

DRAM WITH REDUCED-TEST-TIME-MODE

Matter enclosed in heavy brackets [ ] appears in the original patent but forms no part of this reissue specification; matter printed in italics indicates the additions made by reissue.

This application is a continuation, of application Ser. No. 939,137, abandoned, filed Dec. 8, 1986.

BACKGROUND OF THE INVENTION

The present invention relates to a semiconductor memory device incorporating a field effect transistor, and particularly to improvements in such a semiconductor memory for shortening the test time.

The storage capacity of semiconductor memory devices is making rapid progress: the capacity is quadrupled every 3 years or so. The time required for testing the operation of the memory device is increased with the increasing storage capacity.

A dynamic RAM of a 1 M words ×1 bit configuration in which the addresses are duplexed and which has been placed on the market is shown in 1985 IEEE ISSCC, p. 238, "An 85 ns 1 Mb in a plastic DIP", Yasukazu Inoue, et al., and 1985 IEEE ISSCC, p. 240, "A 90 ns 1 Mb DRAM with Multi-Bit Test Mode", Masaki Kumanoya, et al. If, in this dynamic RAM, "0" data is written into all the memory cells and "0" data is read out of all the memory cells, and "1" data is written into all the memory cells and "1" data is read out of all the memory cells, and if the cycle time (the maximum pulse width of the RAS (row address strobe)signal) is 10 microsec., the test time T1 is given by the following equation (1):

$$\begin{aligned} T1 &= 4 \times (\text{"0" write to "0" read, to "1" write to "0" read}) \times 1 \times 10^6 \text{ (memory capacity)} \times 10 \text{ microsec. (cycle time)} \\ &= 40 \text{ sec} \end{aligned} \quad (1)$$

With an ordinary dynamic RAM, the above-described test must be repeated for the maximum (5.5 V) and the minimum (4.5 V) voltages of the operating power source voltage range, and for the highest (70° C.) and the lowest (0° C.) temperatures of the operating temperature range. The total test time T2 will therefore be as follows:

$$T2 = 40 \text{ sec.} \times 4 = 160 \text{ sec.} \ldots \quad (2)$$

The test time given by the equation (2) is relatively long as a test time of an IC, and reduces the productivity.

SUMMARY OF THE INVENTION

An object of the invention is to reduce the test time.

Another object of the invention is to provide a semiconductor memory device of which a plurality of memory cells can be concurrently tested, so that the test time can be reduced.

The invention provides a reduced-time test request detection circuit which responds to a voltage on at least one input terminal exceeding a normal operating range, and an arrangement by which data is concurrently written into a plurality of memory cells and data is concurrently read out of a plurality of memory cells.

BRIEF DESCRIPTION OF THE DRAWINGS

In the accompanying drawings:

FIG. 2A–L is a timing chart showing the operation of the circuit of FIG. 1;

FIG. 5A–M is a timing chart showing the operation of the circuit of FIG. 4;

DETAILED DESCRIPTION OF THE PREFERRED EMBODIMENTS

FIG. 1 shows an examples of a reduced-time test request detection circuit forming a part of a semiconductor memory device according to the present invention.

Figure 1A:
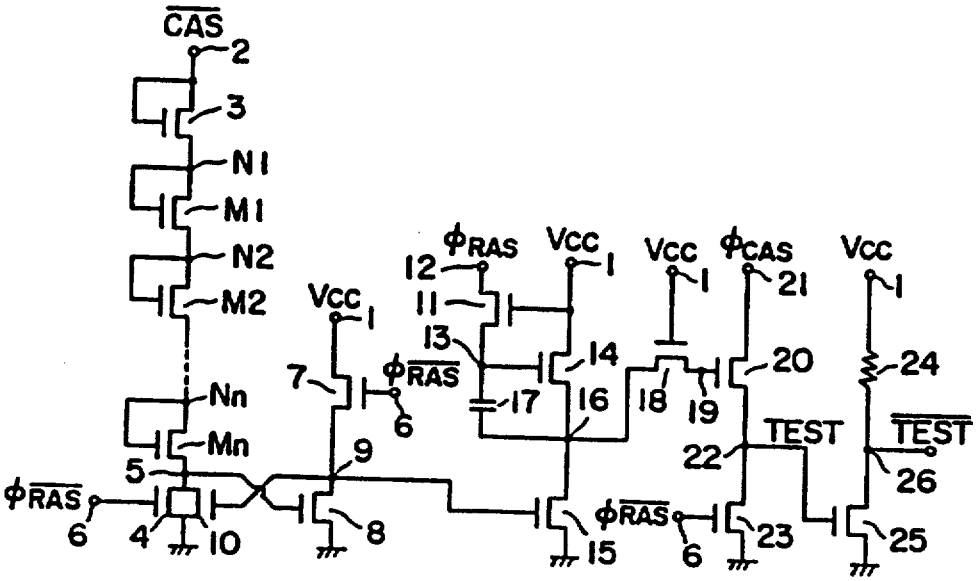
FIG. 1A–C is a circuit diagram showing an example of a reduced-time test request detection circuit of a semiconductor memory device according to the invention.

In FIG. 1A, there are provided a power source terminal 1 to which a power source voltage Vcc is applied, an external input terminal 2 to which an external CAS (column address strobe) input signal is applied, a MOST (MOS transistor) 3 having its drain and gate connected to the external input circuit 2, a MOST M1 having its drain and gate connected together at a junction N1 and connected to the source of the MOST 3, and series connection of MOSTs M2 through Mn having their respective drains and gates connected together at junctions N2 through Nn and connected to the respective source of the MOSTs M1 through M(n-1). There are also provided a MOST 4 having its drain connected at a junction 5 with the source of the MOST Mn, having its source connected to the ground, and having its gate connected to a terminal 6 to which an internal clock signal $\phi$RAS is applied, a MOST 7 having its drain connected to the power source terminal 1, and having its gate connected to the terminal 6, a MOST 8 having its drain connected at a junction 9 with the source of the MOST 7, having its source grounded and having its gate connected to the junction 5, a MOST 10 having its drain connected to the junction 5, having its source grounded and having its gate connected to the junction 9, a MOST 11 having its drain connected to a terminal 12 to which an internal clock signal $\phi$RAS is applied, having its gate connected to the power source terminal 1 and having its source connected to a junction 13, a MOST 14 having its drain connected to the power source terminal 1, having its gate connected to the junction 13, and having its source connected to a junction 16, a MOST 15 having its drain connected to the junction 16, having its source grounded and having its gate connected to the junction 9, and a capacitance element 17 having one electrode connected to the junction 13 and having the other electrode connected to the junction 16, the MOSTs 11, 14 and 15, and the capacitance element 17 form in combination a bootstrap inverter circuit of which the MOST 14 serves as a load transistor, the MOST 15 serves as a driver transistor, the MOST 11 serves as a charging transistor and the capacitance element 17 serves as a boosting capacitor.

There are further provided a MOST 18 having its drain connected to the junction 16, having is source connected a junction 19 and having its gate connected to the power source terminal 1, a MOST 20 having its drain connected to a terminal 21 to which an internal clock signal $\phi$CAS is supplied, having its gate connected to the junction 19 and having its source connected to a junction 22, a MOST 23 having its drain connected to the junction 22, having its gate connected to the terminal 6 and having its source grounded, a resistor 24 having one end connected to the power source terminal 1 and having the other end connected to a junction 26, and a MOST 25 having its drain connected to the junction 26, having its gate connected to the junction 22 and having its source grounded.

Figure 1B:
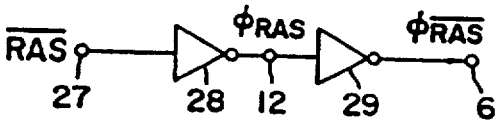

FIG. 1B shows a circuit for producing internal RAS signals $\phi$RAS and $\phi$RAS which are respectively applied to the terminals 12 and 6 shown in FIG. 1A.

As illustrated in FIG. 1B, there are provided an inverter circuit 28 having its input terminal connected to a terminal 27 to which an external RAS (row address strobe) signal is applied, and having its output terminal connected to the terminal 12 identical to the terminal 12 of FIG. 1A, and an inverter circuit 29 having its input terminal connected to the terminal 12, and having its output terminal connected to the terminal 6 identical to the terminal 6 Of FIG. 1B.

Figure 1C:
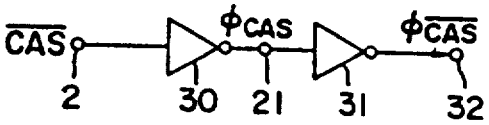

FIG. 1C shows a circuit for producing internal CAS signals $\phi$CAS and $\phi$CAS which are respectively applied to the terminal 21 shown in FIG. 1A and a terminal 32.

As illustrated in FIG. 1C, there are provided an inverter circuit 30 having its input terminal connected to the terminal 2 and having its output terminal connected to the terminal 21, and an inverter circuit 31 having its input terminal connected to the terminal 21 and having its output terminal connected to a terminal 32.

Figure 3:
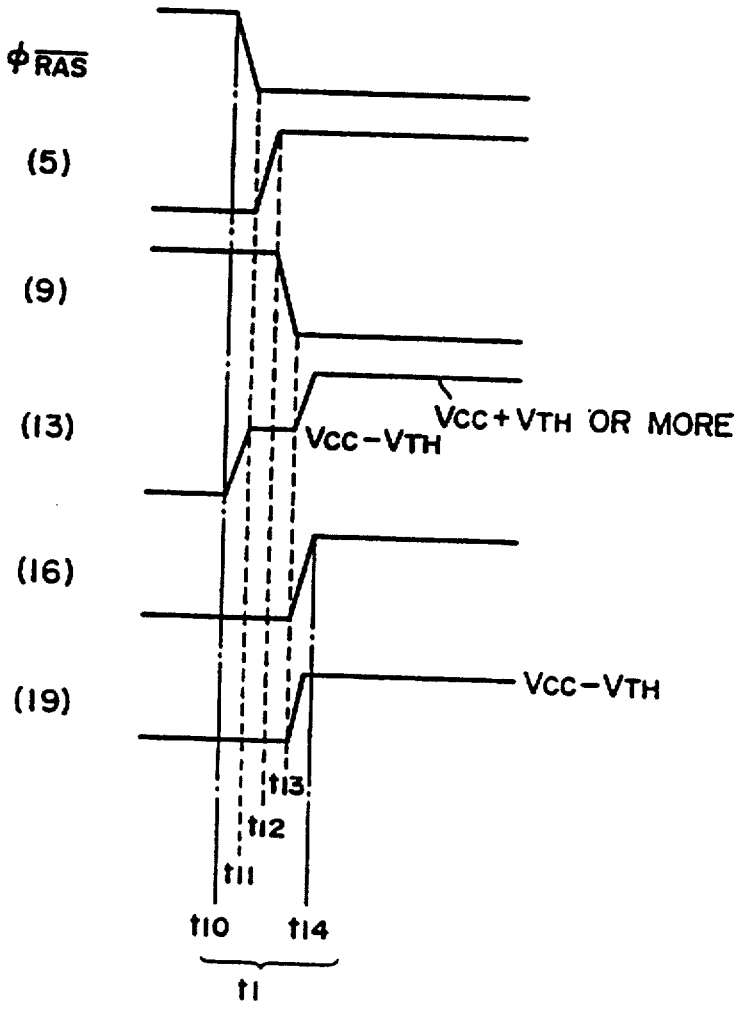
FIG. 3 is a timing chart showing in further detail the operation at t1 in FIG. 2.

The operation of the circuit of FIG. 1 will be described with reference to FIG. 2, and FIG. 3 showing in further detail the operation at the time t1 with an enlarged time scale.

The internal clock signals $\phi$RAS, $\phi$RAS and $\phi$CAS produced from the external signals RAS and CAS are respectively shown in FIG. 2C, 2D and 2E. The illustration of the internal clock signal $\phi$CAS is omitted. Up to the time t1 the signals on the junctions 5, 13, 16 and 22 are at the "L" level, as shown in FIG. 2F, 2H, 2I and 2K, respectively, while the signals on the junctions 9 and 26 are at the "H" level, as shown in FIGS. 2G and 2L, respectively.

At the time t2, the external RAS falls to "L", the $\phi$RAS rises to "H" and the $\phi$RAS falls to "L", as shown in FIGS. 2C and 2D. The transistor 4 is therefore turned off.

If the number n of the MOSTs M1 through Mn is assumed to be 11 (eleven), the total number of the MOSTs connected in series (having their drains and source directly connected to each other) between the terminal 2 and the junction 5 will be 12. If the threshold voltage $V_{TH}$ of the MOSTs 3 and M1 through Mn is assumed to be 0.5 V, the series connection of the MOSTs 3 and M1 through Mn is equivalent to a single MOST having a threshold voltage of $0.5\times12=6$ V and having its drain and gate connected to the terminal 2 and having its source connected to the junction 5. If the voltage value of the "H" level of the external CAS signal is 5 V, which is the value under the normal operating condition, the "H" level of the external CAS input is below the threshold voltage (6 V) of the equivalent MOST, which therefore does not conduct so that the states of the junctions 5 and 9 do not change. In this state, the memory device performs the normal operation.

If the "H" level of the external CAS input is set at a value, such as 10 V, as shown in FIG. 2B, higher than the threshold voltage of the equivalent MOST, the equivalent MOST turns on when the $\phi$RAS falls to "L". As the ON resistance of the MOST 10 is set at sufficiently higher than the ON resistance of the equivalent MOST, the potential on the junction 5 is increased with the level of the CAS, so that the MOST 8 is turned on. Accordingly, the potential on the junction 9 falls to "L".

As is better illustrated in FIG. 3, the junction 13 is charged at t11, to a voltage $Vcc\text{-}V_{TH}$, lower than the power source voltage Vcc by the threshold voltage $V_{TH}$ of the MOST 11, so that the MOST 14 is conductive. If, in this state, the gate voltage of the MOST 15 falls from "H" to "L" (t12–t13) due to the MOST 8 turning on, the MOST 15 is turned off, and the level of the junction 16 rises from "L" to "H" (t13–14). The voltage increment is transmitted through the capacitor 17 and pushes up the level of the junction 13 to a value higher than $Vcc+V_{TH}$, and increases the level of the junction 16 to Vcc. As a result, the level of the junction 19 is charged up to the voltage $Vcc-V_{TH}$ lower than Vcc by the threshold voltage $V_{TH}$ lower than Vcc by the threshold voltage $V_{TH}$ of the MOST 18.

At the time t2, the external CAS signal falls to "L", as shown in FIG. 2B, and $\phi$CAS rises to "H". The MOST 23, with the gate voltage being at "L", is nonconductive. The MOST 20 is conductive. As $\phi$CAS rises from "L" to "H", the potential at the junction 19 is pushed up, by virtue of the gate capacitance of the MOST 20 as shown in FIG. 2J, to $Vcc+V_{TH}$. The level of a test signal TEST on the junction 22 rises, as shown in FIG. 2K, to Vcc. As the potential level on the junction 22 rises, the MOST 25 turns on, and, as shown in FIG. 21, the level of the test signal TEST on the junction 26 falls from "H" to "L". Thus, the test signal TEST rises to "H" and the test signal TEST falls to "L".

At the time t3, the external RAS rises to "H", and $\phi$RAS falls to "L" and $\phi$RAS rises to "H". In this state, the signals on the junctions 5, 13, 16 and 22 fall to "L", while the signals on the junction 9 and 26 rise to "H". Thus, the test signal TEST falls to "L", and the test signal TEST rises to "H". The test time shortening state is thereby terminated.

An example of a circuit for generating a test signal for bringing about the test time shortening state has been described with reference to FIGS. 1 and 2. Now the memory using the test signal for shortening the test time will be described.

For simplicity of description, it is assumed that a semiconductor memory having a storage capacity of 4 bits, shown in FIG. 4, is taken as an example. The semiconductor memory comprises only 8 terminals or pins, namely an address input terminal on which the addresses are duplexed, and the terminals for RAS, CAS, R/W, $D_{IN}$, $D_{OUT}$, a power source and the ground.

As illustrated in FIG. 4, there are provided memory cells 41a through 41d of one bit, and reading amplifiers 42a through 42d connected at junctions 43a through 43d with the memory cells 41a through 41d and amplifying data read out of the memory cells. The amplifiers are shown to have only one stage, but commonly two-stage amplifiers are used. There are also provided MOSTs 45a through 45d connected between a junction 54 and junctions 44a through 44d, and having their gates connected to junctions 47a through 47d. MOST 46a through 46d connected between the junction 54 and the junctions 44a through 44d and having their gates connected to the terminal 22, and MOSTs 49a through 49d connected between junctions 48a through 48d and a junction 55, and having their gates connected the junctions 47a through 47d.

There are further provided an external data input terminal 50 to which an external data input is supplied, an output terminal 51 through which an output data is read out, an input buffer 52 having its input terminal connected to the terminal 50 and having its output terminal connected to the junction 54, the activated at the time of writing, a MOST 56 connected between the junction 55 and a junction 57 and having its gate connected to the terminal 26, a MOST 58 connected between the junction 57 and a junction 62 and having its gate connected to the junction 22, and an output buffer 59 having its input terminal connected to the junction 57 and having its output terminal connected to the terminal 51.

There are further provided an input terminal 60 to which an address input is supplied, and a decoder 61 having two-bit address input and having four-bit output. Exclusive-OR circuits 66a through 66d, each having one input connected to a respective one of the junctions 48a through 48d, and having the other input connected to a junction 65, a four-input OR circuit 68 having its inputs connected to the outputs of the Exclusive-OR circuits 66a, through 66d, and an input buffer 63 having its input connected to the terminal 50 and having its output connected to the junction 65, and activated at the time of reading.

Figures 4A, 4B:
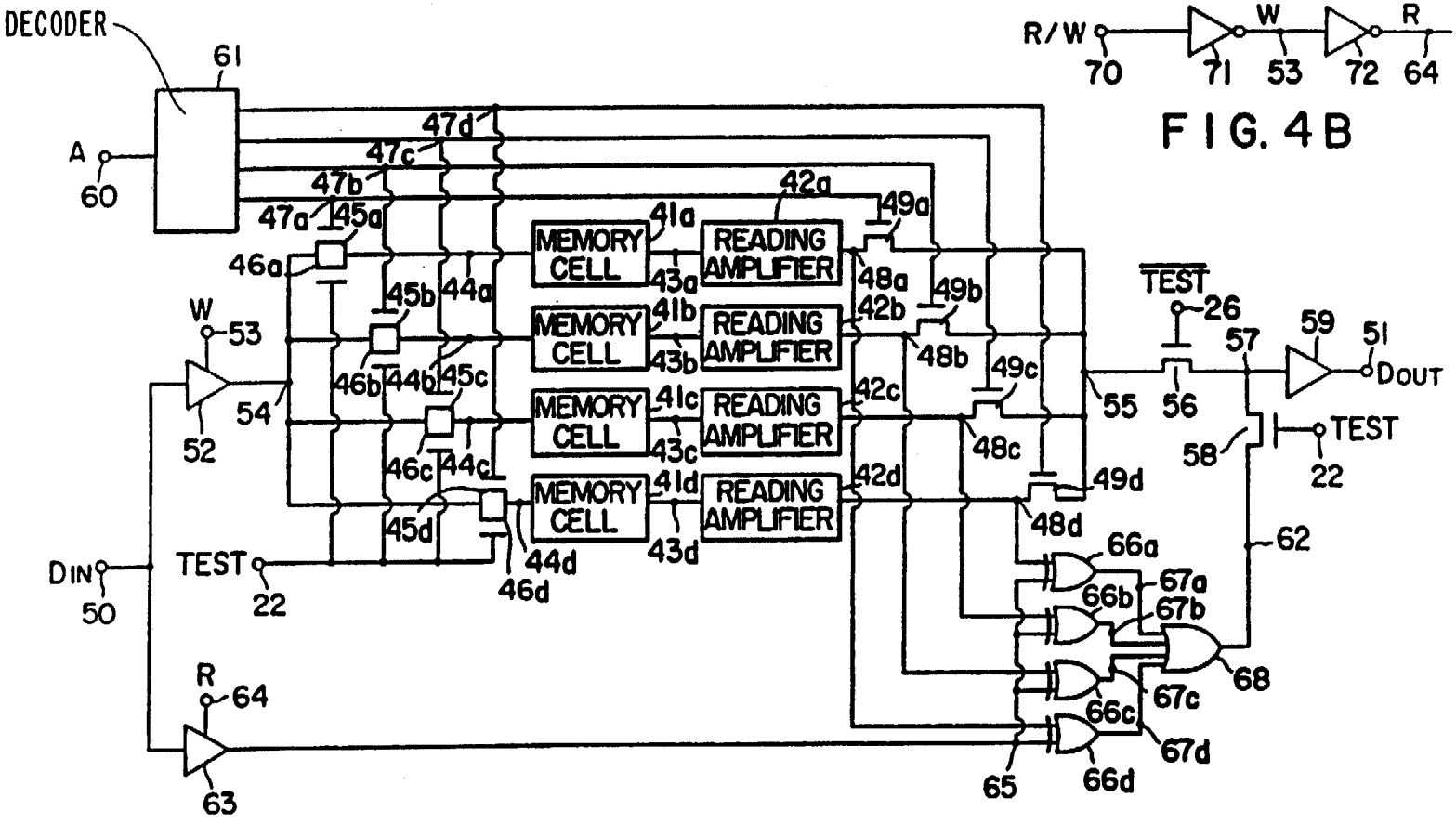
FIG. 4A–B is a circuit diagram showing a semiconductor memory device incorporating the reduced-time test request detection circuit of FIG. 1.

As is shown in FIG. 4B, there are further provided an input terminal 70 to which an R/W input signal is applied, an input buffer 71 connected between the input terminal 70 and the junction 53, also shown in FIG. 4A, to produce a write signal W, and an input buffer 72 connected between the junction 53 and 64, to produce a read signal R.

The operation of the circuit of FIG. 4 will now be described with reference to FIG. 5, which illustrates the operation during writing.

When data is written in, the R/W signal shown in FIG. 5D is set at "0". At the time t1, RAS shown in FIG. 5A falls, when the row address of the duplexed address signal A shown in FIG. 5C is taken in by the decoder 61.

Figures 5H, 5I, 5J, 5K:
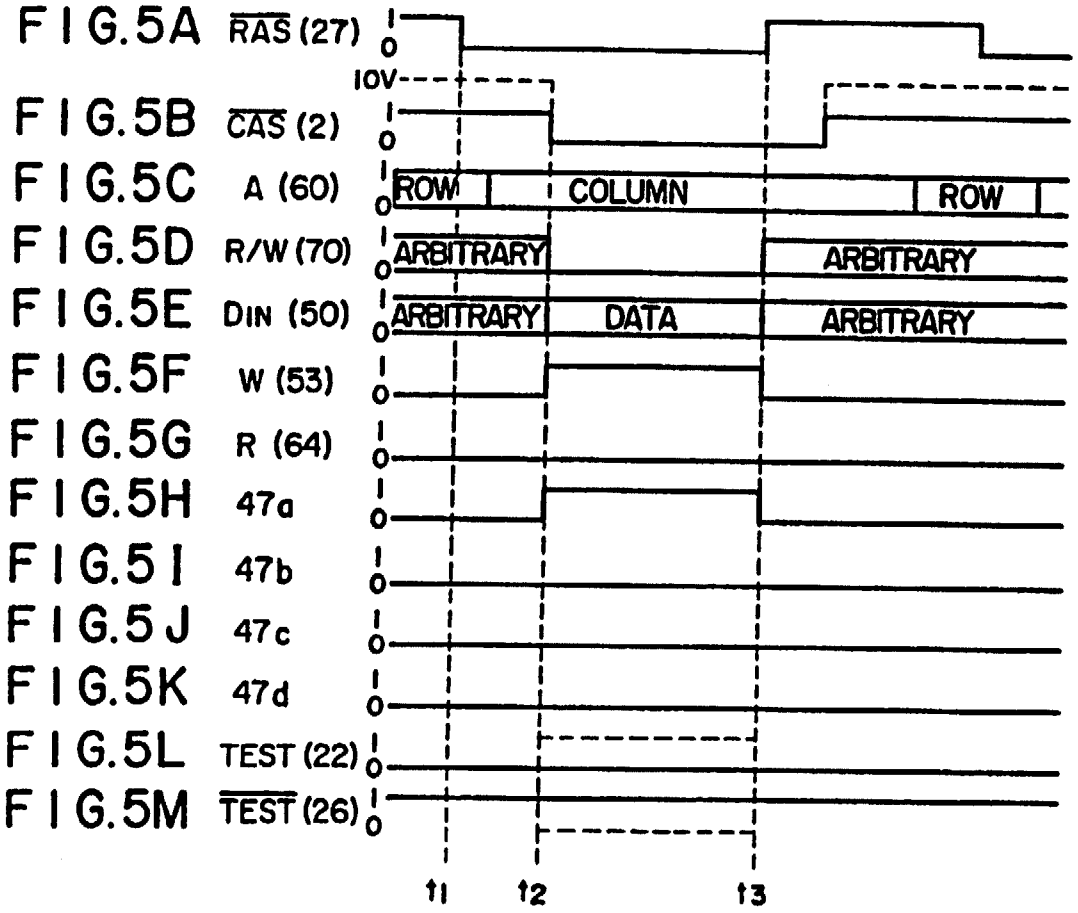

At the time t2, the column address is taken in. Depending on the states of the row address and the column address, one of the four decoder output is set at "1". As an example, the output signal on the junction 47a is shown to be at "1", while the signals on the junctions 47a through 47d are shown to be at "0", as shown in FIGS. 5H through 4K. Accordingly, the MOST 45a is conductive, while the MOST 45b through 45d are non-conductive. The write signal W shown in FIG. 5C is set at "1", as a result of which the input buffer 52 is activated and the data input $D_{IN}$ shown in FIG. 5E is transmitted to the junction 54, and is then transmitted through the MOST 45a, now conductive, and written in the memory cell 41a.

The above description is on ordinary operation which takes place when the "1" level of CAS is at about 5 V. If the "0" level of CAS is raised to 10 V, as shown by a broken line in FIG. 5B, the test signal TEST shown in FIG. 5L becomes "1" and the test signal TEST shown in FIG. 5M becomes "0", as was described with reference to FIGS. 1 and 2. In this state, the MOSTs 46a through 46d are all made conductive, so that the same data on the junction 54 is concurrently written in all the memory cells 41a through 41d. This means that the time required for writing is reduced to ¼ (one fourth) compared with a situation where the MOSTs 45a through 45d are made conductive in turn and the writing into the memory cells 41a through 41d are made in turn.

During reading, the R/W signal is set at "1" and the R signal shown in FIG. 5G is set a "1". As a result, the input buffer 63 is activated, and the input signal $D_{IN}$ supplied to the input terminal 50 is transmitted to the junction 65.

The data read out of the memory cells 41a through 41d are amplified by the amplifiers 42a through 42d and transmitted to the junctions 48a through 48d. These data are compared with the input data $D_{IN}$ at the Exclusive-OR circuits 66a through 66d. The outputs of the Exclusive-OR circuits 66a through 66d are at "0" or at "1", depending on whether or not the data from the memory cells 41a through 41d are coincident with the input data $D_{IN}$. If any of the Exclusive-OR circuits 66a through 66d produces "1" reflecting the fact that the data from the corresponding memory cell is not coincident with the input data $D_{IN}$, the output of the OR circuit 68 becomes "1". Thus, the data from the four memory cells 41a through 41d can be simultaneously checked. The test time is therefore reduced to ¼.

The circuit comprising MOSTs 56 and 58 constitute a switch between an ordinary operation mode and a reduced test tie operation mode. In the ordinary operation mode, the MOST 56 is made conductive, and the data from the memory cell selected by the output of the decoder 61 is transmitted to the output buffer 59.

In the reduced test time operation mode, the MOST 58 is made conductive, so that the output of the OR circuit 68 is transmitted to the output buffer 59, and hence to the output terminal 51. It is therefore possible to make judgement on the memory cell data from the data on the output terminal 51. That is, "1" on the output terminal 51 reflects presence of an error, while "0" reflects absence of an error.

In the embodiment described, the "1" level of the CAS input is raised for producing the test signals TEST and TEST. The invention is not limited to such an arrangement. That is, "1" level of any other input signal may alternatively be raised during the period when the R/W signal and the $D_{IN}$ signal are in an arbitrary state.

A second embodiment of a semiconductor memory according to the invention will now be described with reference to FIG. 6.

The semiconductor memory device of this embodiment of the invention comprises a memory cell array 80 having 262,244 memory cells arranged in 512 ($=2^9$) rows and 512 ($=2^9$) columns to form a matrix. The memory cell array 80 is divided into four blocks 85 through 88, each block having 262,144/4= 65,536 memory cells. Denoted by numerals 81 through 84 are unit memory cells of a single bit occupying the same positions within and with respect to the respective blocks 85 through 88.

To select one memory cell within the memory cell array 80, 9 bits (RA0 through RA8) for a row address signal and 9 bits (CA0 through CA8) for a column address signal i.e., 18 bits in all are needed. If, however, four memory cells, e.g., 81 through 84 are simultaneously selected, the most significant bits (RA8 and CA8) of the column address signal and the row address signal are not necessary. This facilitates realization of the second embodiment. Dynamic RAMs which are widely manufactured today have a system where each bit of the row address signal and a corresponding bit of the column address signal are supplied, using a time-sharing technique, through a single input terminal. For instance, the dynamic RAM shown in FIG. 6 has 9 address input terminals A0 through A8, through which 9 bits RA0 through RA8 of the row address signal are supplied and then 9 bits CA0 through CA8 of the column address signal are supplied.

When the four memory cells are to be simultaneously selected, the terminal A8 is not necessary for the purpose of supplying an address signal. It is therefore possible use the terminal A8 to apply a high DC voltage for generating the test signals. In this embodiment, it is only necessary to apply a high DC voltage, so that the circuit arrangement is simpler than the example of FIG. 1 where the "1" level of CAS needs to be raised.

Figure 6:
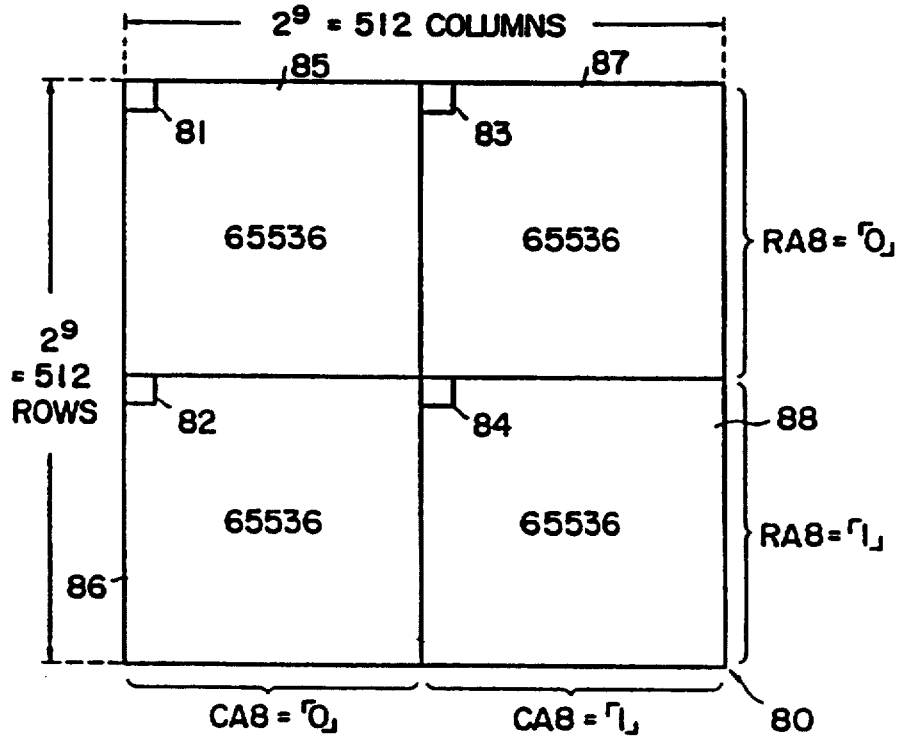
FIG. 6 is a schematic view showing, a second embodiment of the invention.
Figure 7A:
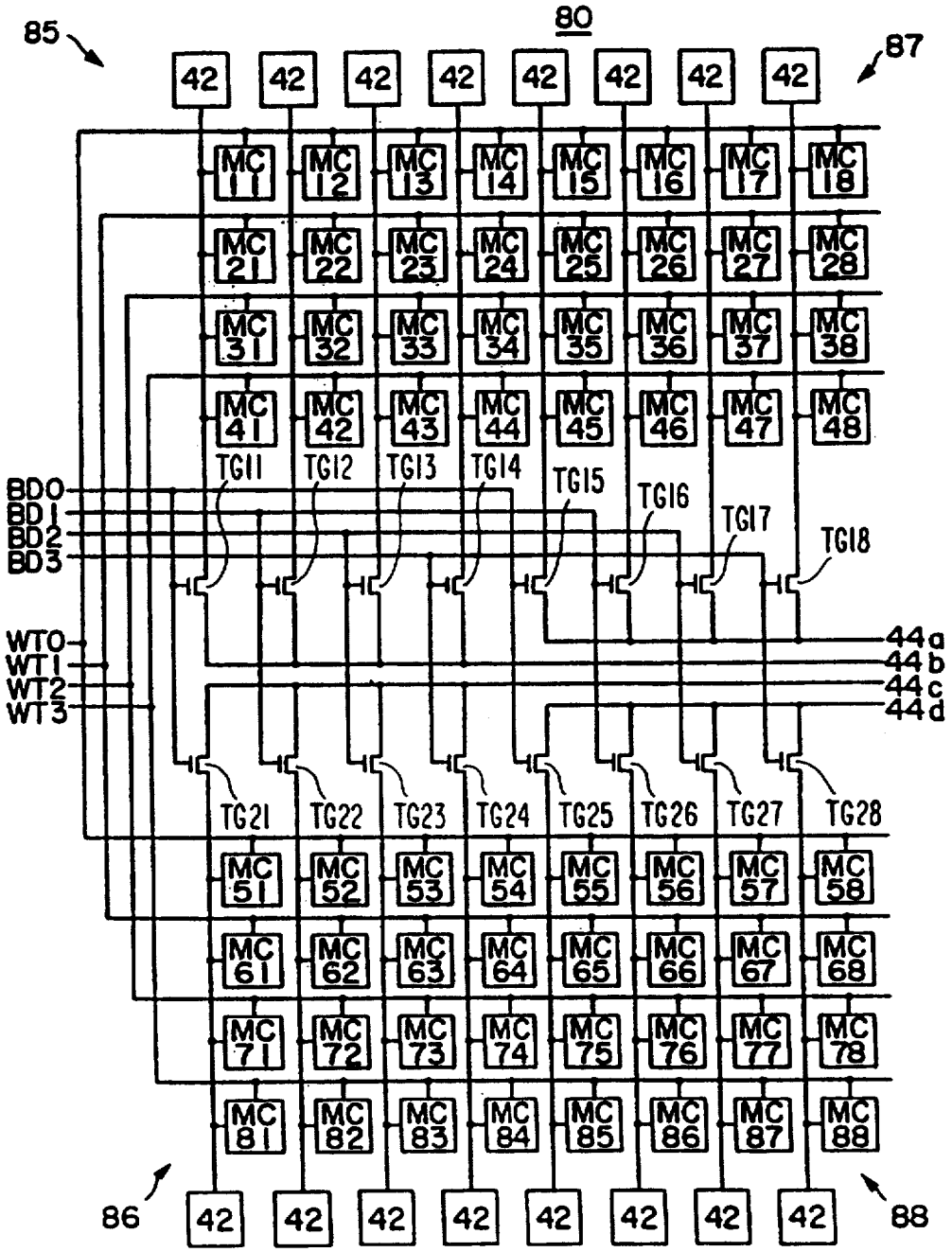
FIG. 7A–C is a schematic view showing, in further detail, the embodiment of FIG. 6.
Figure 7B:
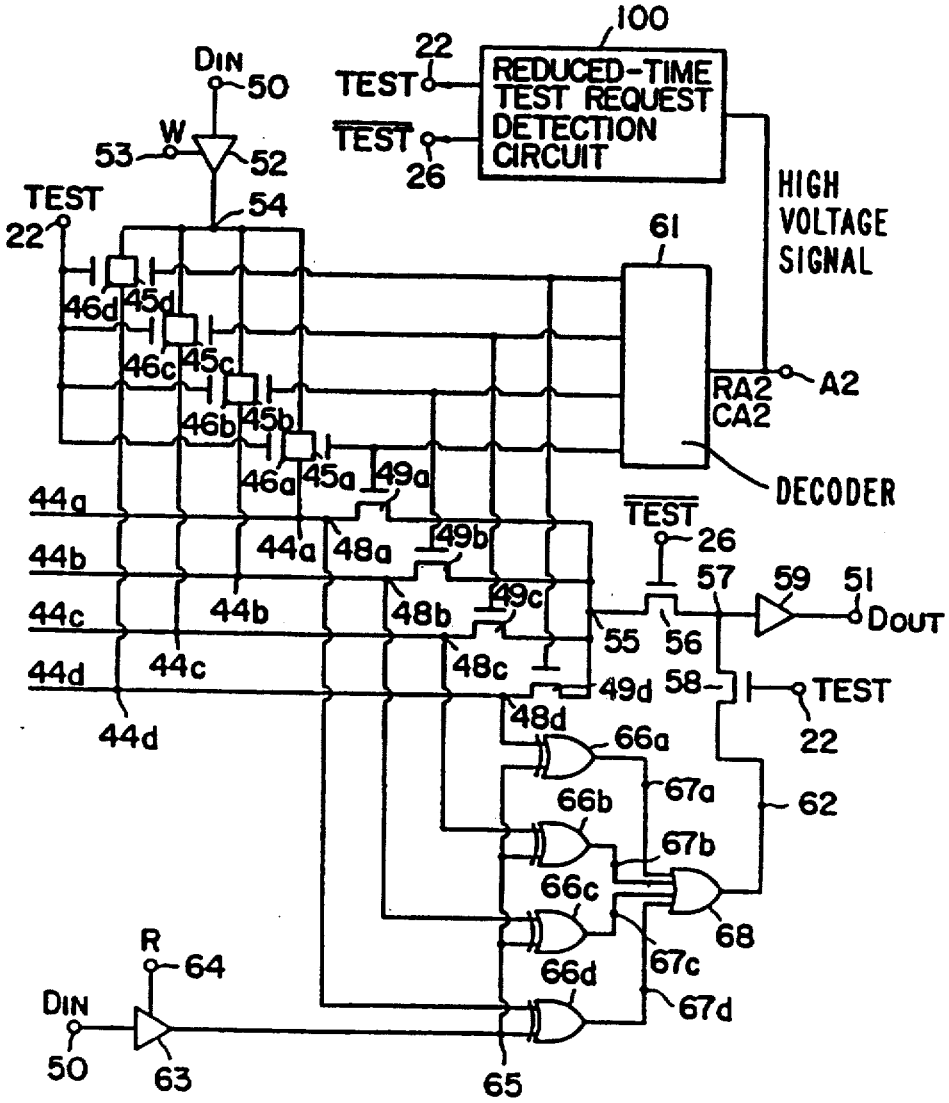
Figure 7C:
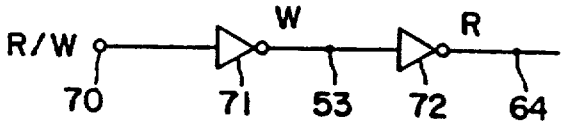

FIGS. 7A, 7B and 7C illustrate in further detail how the concept of the embodiment of FIG. 6 is implemented. For simplicity of illustration and description, the memory cell array 80 is shown to comprise only 64 memory cells MC11 through MC88 arranged in 8 rows and 8 columns. The array is divided into four blocks 85, 86, 87, and 88, each comprising 16 memory cells arranged in 4 rows and 4 columns. All the bit lines of each block are connected through a respective one of transfer gates TG11 through TG28 to a respective one of the 4 lines or nodes 44a through 44d.

To select one of the memory cells, 3 bits (RA0 through RA2) for a row address signal and 3 bits (CA0 through CA2) for a column address signal are inputted. The MSB (RA2) of the row address signal and the MSB (CA2) of the column address signal are supplied to the decoder 61, which thereby selects on of the lines 44a through 44d. The remaining bits (RA1, RA0) of the row address signal are supplied to a row decoder, not shown, to select one of the lines WT0 through WT3 thereby selecting one of the word lines in each block. The remaining bits CA1, CA0) of the column address signal are supplied to a column decoder, not shown, to select one of the lines BD0 through BD3 thereby selecting one of the bit lines in each block. The bit lines are respectively connected to amplifiers 42.

During an ordinary operation, four memory cells, e.g. MC11, MC15, MC51, MC55, at the same position within the respective blocks are selected by the outputs of the row address decoder and the column address decoder, and one of the four memory cells are selected by the outputs of the decoder 61.

When a reduced-time test is to be conducted the MSBs of the row address signal and the column address signal are not supplied and instead a high DC voltage commanding the test is inputted through the address terminal A2 for the MSBs (RA2, CA2). This high DC voltage is detected by a reduced-time test request detection circuit 100, by which the test signals TEST and TEST are produced, and all of the four memory cells selected by the row address decoder and the column address decoder are concurrently accessed.

As has been described, according to the invention, a plurality of memory cells are simultaneously tested by raising above the range of the levels supplied under ordinary operation condition, the level of one of the input signals. The test time can therefore be reduced. This reduction in the test time does not require increase in the number of terminals.

What is claimed is:

1. A semiconductor memory device, comprising:

a plurality of address lines, a plurality of memory cells coupled with said address lines, a test request detection circuit means to produce a test signal if a voltage has been applied on a most significant one of said address lines which is higher than a range of voltages supplied under ordinary operation conditions, means responsive to the test signal for causing writing of data, which has been supplied to the semiconductor memory device, into a plurality of memory cells simultaneously, and thereafter, simultaneously reading data from said plurality of memory cells, and means for judging whether or not the data read from said plurality of memory cells coincides with the data originally supplied to the semiconductor memory device.

2. A device according to claim 1, wherein said judging means comprises a plurality of judging circuits receiving the data having been supplied to the semiconductor memory device and the data read out of the respective memory cells.

3. A device according to claim 2, wherein each of the judging circuits comprises an Exclusive-OR circuit whose output is at "1" if the data read out of the corresponding memory cell does not coincide with the data having been supplied to the semiconductor memory device.

4. A device according to claim 3, wherein said judging means further comprises an OR circuit receiving the output of the Exclusive-OR circuit to produce an error detection signal if any of the Exclusive-OR circuit produces an output of "1".

5. A device according to claim 2, wherein said judging means outputs results indicating whether data read out from ones of the memory cells coincides with data originally supplied to the semiconductor memory device onto an external terminal.

6. A device according to claim 1, wherein each of the memory cells comprises a field effect transistor.

7. The memory of claim 1, wherein said memory is a dynamic random access memory (DRAM).

8. The memory of claim 1, wherein said test request detection circuit contains plural FETs connected together to provide an effective threshold voltage which is outside of the range of voltages supplied under ordinary operation conditions.

9. A semiconductor memory device, comprising:

at least one array of memory cells coupled with said address lines;

peripheral logic connected to select ones of said memory cells for reading or writing in accordance with externally received cell address signals, wherein ones of said cell address signals are sequentially multiplexed onto a set of address lines which are less than the number needed to uniquely identify one of said cells;

a test request detection circuit means to produce a test signal if a voltage has been applied on a most significant one of said address lines which is higher than a range of voltages supplied under ordinary operation conditions;

a parallel addressing circuit, which causes said peripheral logic to write externally supplied data into a plurality of said memory cells simultaneously, when said test detection circuit indicates that a high voltage has been received; and at least one judging circuit, which ascertains whether a memory cell has correctly repeated the data value which was stored in it.

10. A semiconductor memory device, comprising: a plurality of subarrays of memory cells;

peripheral logic connected to select ones of said memory cells for reading or writing in accordance with externally received cell address signals, wherein ones of said cell address signals are sequentially multiplexed onto a set of address lines which are less than the number needed to uniquely identify one of said cells;

a test request detection circuit means to produce a test signal if a voltage has been applied on a most significant one of said address lines which is higher than a range of voltages supplied under ordinary operation conditions;

a parallel addressing circuit, which causes said peripheral logic to write externally supplied data into a plurality of said memory cells, in plural respective ones of said subarrays, simultaneously, at locations determined by data on the ones of said address lines on which said voltage was not applied, when said test detection circuit indicates that a high voltage has been received; and at least one judging circuit, which ascertains whether a memory cell has correctly repeated the data value which was stored in it.

11. The memory of claim 9, wherein said test request detection circuit contains plural FETs connected together to provide an effective threshold voltage which is outside of the range of voltages supplied under ordinary operation conditions.

12. The memory of claim 10, wherein said test request detection circuit contains plural FETs connected together to provide an effective threshold voltage which is outside of the range of voltages supplied under ordinary operation conditions.

13. The memory of claim 9, wherein said parallel addressing circuit causes said peripheral logic to write externally supplied data into a plurality of said memory cells at locations determined by data on ones of said address lines on which said voltage was not applied.

*14. A semiconductor memory device, comprising:*

*(a) a plurality of address lines;*

*(b) a plurality of memory cells coupled with said address lines;*

*(c) a test request detection circuit means to produce a test signal upon receipt of a higher voltage which is higher than a range of voltages applied under ordinary operation conditions, said test request detection circuit means comprising*

*(i) an input terminal for receiving said higher voltage,*

*(ii) a series connection of a plurality of MOSTs, each having a gate and a drain, wherein said series connection of MOSTs is connected at a first end to said input terminal, and wherein each of said MOSTs has its gate and drain coupled together,*

*(iii) a latch circuit, coupled to a second end of second series connection of MOSTs at a first end of said latch circuit,*

*(iv) an inverted test signal generating circuit responsive to an output end of said latch circuit, wherein said test signal generating circuit produces an inverted test signal, and*

*(v) a reset circuit for resetting said latch circuit;*

*(d) means responsive to the test signal for causing writing of data, which has been supplied to the semiconductor memory device, into a plurality of memory cells simultaneously, and thereafter, simultaneously reading data from said plurality of memory cells; and*

*(e) means for judging whether or not the data read from each of said plurality of memory cells coincides with one another.*

*15. The semiconductor memory device of claim 14, wherein said latch circuit comprises two MOSTs cross-coupled with each other, wherein each of said MOSTs contain a gate, and wherein the gate of one of said MOSTs is coupled to said second end of said series connection of MOSTs.*

*16. The semiconductor memory device of claim 15, wherein said reset circuit comprises at least one MOST which couples the gate of at least one of said two MOSTs to a power supply node.*

*17. A semiconductor memory device, comprising:*

*at least one array of memory cells coupled with said address lines;*

*peripheral logic connected to select ones of said memory cells for reading or writing in accordance with externally received cell address signals, wherein ones of said cell address signals are sequentially multiplexed onto a set of address lines which are less than the number need to uniquely identify one of said cells;* a test request detection circuit means to produce a test signal if a voltage has been applied on a most significant one of said address lines which is higher than a range of voltages supplied under ordinary operation conditions;

*a parallel addressing circuit responsive to the test signal for causing said peripheral logic to write externally supplied data into a plurality of said memory cells simultaneously; and*

*at least one judging circuit, which ascertains whether said plurality of memory cells have correctly repeated the data value which was stored in them.*

* * * * *